May 28, 1963 A. R. HUTSON 3,091,707

PIEZOELECTRIC DEVICES UTILIZING ZINC OXIDE

Filed April 7, 1960

INVENTOR
A. R. HUTSON
BY George S. Indig
ATTORNEY

United States Patent Office 3,091,707

Patented May 28, 1963

3,091,707 PIEZOELECTRIC DEVICES UTILIZING ZINC OXIDE

Andrew R. Hutson, Plainfield, N.J., assignor to Bell Telephone Laboratories, Incorporated, New York, N.Y., a corporation of New York Filed Apr. 7, 1960, Ser. No. 20,572
6 Claims. (Cl. 310—8)

This invention relates to piezoelectric device elements utilizing zinc oxide as the active material and to devices including such elements.

It is unnecessary to discuss at any length the role played by piezoelectric devices in modern technology. Quartz filters and resonators have played an important role for decades. The literature abounds with reference to other piezoelectric materials, E.D.T., A.D.P., etc., finding use in piezoelectric devices such as hydrophones, sonar devices, delay lines, transducers, and other ultrasonic generators and detectors. Probably quartz is the best known piezoelectric material. Its popularity, in large part, is due to its physical and chemical stability. It is generally unreactive with atmospheric components, is stable over long use and withstands relatively high physical strain. The organic materials, many of which were developed during World War II in expectation of a quartz shortage, although possessed of significantly larger coupling coefficients, dissolve in water, are chemically unstable and are otherwise unsuitable for many uses to which quartz is put.

For many uses, a need exists for a piezoelectric material having a higher coupling coefficient than quartz and otherwise evidencing the excellent physical and chemical properties of this material. In the past, it has been possible to meet some of these needs by means of hermetically sealed organic crystals. Housings are so designed that interaction with atmospheric components is avoided, and so that mechanical coupling is permitted, usually by means of rubber or other yieldable housing sections. In most uses, however, it has been necessary to continue using quartz despite its inefficient energy conversion.

In accordance with this invention, it has been discovered that zinc oxide combines many of the best piezoelectric attributes of the two classes of prior art materials. This material does not react with normal atmospheric components, does not dissolve in water, and is otherwise of known chemical and physical stability. Its maximum electromechanical coupling constant exceeds 0.3 and compares quite favorably with the maximum coefficient of 0.095 for X-cut quartz. Except for its photosensitivity, other properties of significance in piezoelectric devices are generally favorable and are described herein.

Zinc oxide, a II–VI semiconductor material of n-type conductivity as made by any of the conventionally reported growth methods (i.e., from the vapor phase, from flux or by hydrothermal methods) has received some attention in the past as possibly suitable for use in semiconductor devices. Whereas methods for compensating the predominant n-type conductivity mechanism have been dweveloped, there are, as far as is known, no published accounts of any method successfully utilized to produce a p-type conductivity mechanism in this material. Some of the techniques developed during these studies have, however, been of value in the work described herein.

To successfully utilize any piezoelectric material in a device, it is first necessary to produce a sound crystal (zinc oxide has not been observed to manifest ferroelectric properties so that orientation of polycrystalline bodies does not appear feasible). Sound crystals have been grown by each of the methods noted above. Since much of the work has not been described in the literature, an exemplary method for growing zinc oxide from the vapor phase is included in this description. Additionally, zinc oxide crystals exhibiting an unusual plate-like habit may be grown under specified conditions by a flux method described in copending application Serial No. 20,643, filed Apr. 7, 1960. Crystals produced by either technique may be utilized as seeds in a hydrothermal method, developed by R. A. Laudise and described in Journal of Physical Chemistry, April 1960, to produce massive crystals.

Successful incorporation of any material as the operative element in a piezoelectric device requires the virtual elimination of any natural conductivity mechanism which otherwise has a damping effect on fields produced across the crystal. As noted, zinc oxide is generally strongly n-type as grown, usually manifesting a conductivity of the order of at least 0.01 $ohm^{-1}cm.^{-1}$. Although any method suitable for decreasing conductivity to a desired level is suitable, it has been found convenient to minimize the conductivity mechanism by use of lithium. One such method successfully adapted in this work is described.

Workers in the art are aware of a large class of devices for which zinc oxide, by reason of its enumerated characteristics, is suitable. In a discussion of such device uses, reference is had to the drawing, in which.

Figure 1:
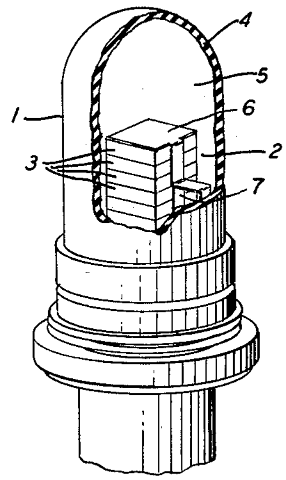
FIG. 1 is a perspective view, partly in section, of a hydrophone utilizing a stacked zinc oxide crystal array as the active element.

Due to the paucity of literature references to zinc oxide, and in the interest of minimizing experimentation by workers reproducing any of the work described, it may be helpful to describe an actual crystal growing and conductivity compensating method which resulted in crystals upon which some of the measurements here reported were made. The following discussion relates to a specific method utilized in growing such a crystal of zinc oxide and outlines also a procedure utilized for reducing room temperature conductivity from an initial n-type value of the order of 0.2 $ohm^{-1}cm.^{-1}$ to of the order of about $10^{-10}$ $ohm^{-1}cm.^{-1}$. For convenience, the discussion is largely in terms of specific processing conditions. Although some mention is made of ranges, it should be understood that these methods are not uniquely adaptable to producing suitable zinc oxide crystals, that the techniques are not considered inventive per se, and that, therefore, no attempt is made to present exclusive ranges of conditions.

*Growth of Zinc Oxide From a Vapor Phase*

Zinc vapor and oxygen are caused to combine chemically in the hot zone of a furnace maintained at between 1250 and 1300° C. The particular furnace configuration used utilized a globar element that included a main cylindrical chamber made of aluminum oxide and a smaller concentric cylindrical tube of the same material. The smaller tube was open-ended and terminated at a position approximately corresponding to the highest temperature zone of the furnace. The entire apparatus was disposed horizontally. Zinc oxide powder was placed near the end and on the lower inner surface of the smaller tube. Air was caused to flow into the furnace through a separate port. The powdered zinc oxide was maintained in the furnace until it had reached equilibrium at the said temperature, after which a carrier gas mixture of nitrogen and a minor amount of wet hydrogen (1500–2000 cm./min. $N_2$—0.5–1.0 cm./min. wet $H_2$) was introduced into the smaller tube so as to pass over the zinc oxide powder. The effect of this gaseous mixture was to reduce the zinc oxide and to then act as a carrier to transport the reduced zinc vapor out of the inner tube into the central region of the furnace where it reacted with the oxygen component of the air to produce crystalline zinc oxide growth in the vicinity of the end of the inner concentric chamber. Longitudinal growth was at the rate of about one centimeter per hour. Nucleation occurred primarily at the end of the inner concentric tube, so that withdrawal was accomplished simply by withdrawing this chamber.

A typical run utilizing 30 grams of zinc oxide powder resulted in a mass of crystalline zinc oxide of about one gram and included of the order of about 100 crystals, the larger of which were of the order of from one to two centimeters in length and three-tenths millimeter in cross section. The form of these crystals were generally acicular, and of hexagonal cross section. Electrically, all evidenced predominant n-type conductivity, typically at a level of 0.2 $ohm^{-1}cm.^{-1}$ at room temperature.

*Compensation of Extrinsic Conductivity Mechanism*

A 2.96 millimeter section was cut from a longer crystal by use of a diamond saw, so resulting in flat parallel cut ends. The cut crystal was next dip coated with an aqueous solution of lithium hydroxide. The coated crystal was placed in a small magnesium boat which was, in turn, inserted in a small resistance heated furnace and was maintained at a temperature of 750° C. overnight in an air atmosphere. The coating of lithium hydroxide left a white residue on the crystal after dipping, some of which was retained after heat treatment. It will be recognized that the amount of lithium so introduced into the system is in excess of that required to compensate for the number of n-type carriers present. Considerations relative to the minimum amount of acceptor impurity required to compensate for the usual donor level found in the crystals as grown are discussed further on, as are tolerable conductivities based on certain assumed device operating conditions. Resistivity measurements made on typical crystals, treated as described, by use of a four-point probe indicated values of the order of $10^{-4}$ $ohm^{-1}cm.^{-1}$ at a temperature level of the order of 725° C.

*Determination of Electrical Characteristics*

Two types of measurements were then made on the crystal. In the first of these, the specimen was supported by two parallel, horizontal nylon fibers and was capacitively coupled to an apparatus additionally consisting of a radio frequency signal generator and an oscilloscope. Capacitive coupling was accomplished by means of two shielded electrodes. These electrodes were made up of standard coaxial male connectors, the conductor at each terminus being shielded by use of a washer soldered to the outer conductor. The inner conductor of one such connector was attached to the generator, the other to the oscilloscope, and the outer conductors were grounded, as were the second leads from the generator and scope.

During this measurement, the output frequency of the generator was gradually increased over a range of 100 kilocycles to 10 megacycles per second, and corresponding outputs were observed on the scope. Below resonance, the crystal acted as a simple dielectric material, and no variation was noted in output. For this crystal, peaks were observed at frequencies of 866 kilocycles and integral multiples of this frequency. The first of these represented the fundamental length resonance in this zinc-oxide rod. Based on $$v=2fL \qquad (1)$$

in which $v$=velocity in centimeters per second
$f$=frequency in cycles per second
$L$=length of crystal in centimeters, the velocity of sound was calculated to be $5.1\times10^5$ centimeters per second.

The piezoelectric coupling coefficient was calculated from these measurements by the resonance-antiresonance method. See W. P. Mason, "Piezoelectric Crystals and Their Application to Ultrasonics," Chapter 5, D. Van Nostrand Company, Incorporated (1950). The actual method used was that outlined for a preferred configuration in which the effect of fringing fields was minimized. Since there was, in fact, an appreciable fringing field, the value so obtained was conservative. This measurement was of value chiefly in determining that the crystals would resonate, that is, that they were piezoelectric, and as a basis for determining the velocity of sound in this material. Actual coupling coefficients were more accurately determined on the basis of direct measurements made of the piezoelectric constants, $d_{33}$, $d_{31}$ and $d_{15}$. These constants define the entire hexagonal Wurtzite system since the only other tensor components not equal to zero are equal to one or another of these values, so $d_{31}$ equals $d_{32}$ and $d_{15}$ equals $d_{24}$. The methods used for this measurement are described below.

*Direct Measurement of Piezoelectric Constant*

The crystal to be measured was placed in an apparatus between, and electrically connected with, an adjustable lower electrode and a movable upper electrode. The upper electrode was affixed to the end of a phosphor bronze leaf spring and was electrically grounded. The lower electrode was adjusted so that the crystal contacted the upper electrode. The remainder of the apparatus included a means for applying a calculable force to the upper end of the crystal, an air capacitor of known capacitance used to minimize decay time, and a vibrating reed electrometer (Carey Model 31A) used to measure generated voltage. One terminal of each of these three elements was grounded. The other terminals were electrically connected so that the crystal, air capacitor and electrometer were electrically in parallel. The effect of applying a force to the crystal was to change the charge on the capacitor due to the piezoelectric effect, which could be determined by the change of voltage measured by the electrometer.

Two precautions were taken to avoid apparatus-introduced errors. Three different weights were applied and readings taken to balance out errors due to spring tensions. Piezoelectric constants determined on the basis of each of the measured fields so developed showed a maximum error of five percent. To serve as a basis for the determination of stray capacitances introduced into the circuit, the value of the air capacitor was varied over a range of from 200–1600 micromicrofarads. It was determined that errors due to such stray capacitances were within experimental error and could be ignored. On the basis of this measurement, the piezoelectric constant $d_{33}$ was determined to be equal to $3.6\times10^{-7}$ stat coulombs/dyne.

The measurement of $d_{31}$ was accomplished making use of a bar of zinc oxide cut from a flux-grown platelet which had been treated with lithium as described in the aforementioned copending application Serial No. 20,643, filed April 7, 1960. This bar had a thickness of .28 millimeter along the hexagonal C-axis, a length of 7.09 millimeters and width of 3.7 millimeters, both perpendicular to the C-axis. Silver electrodes were chemically deposited on the opposite large faces perpendicular to the C-axis. Resonant and antiresonant frequencies were measured corresponding to the fundamental length vibration mode of this bar using a radio-frequency signal generator, an oscilloscope as amplifier and detector, and a well shielded crystal holder in which shunt capacity was negligible for this crystal. An electromechanical coupling constant of 0.18 and a Young's modulus (for strain perpendicular to the C-axis and at constant electric field) of $8.35\times10^{-13}$ $cm.^2$/dyne were computed using the method outlined in W. P. Mason, op. cit. Utilizing the value 8.15 for the dielectric constant at constant strain obtained by R. J. Collins, Journal of the Physics and Chemistry of Solids, volume 11, page 190 (1959), a value of $d_{31}=d_{32}=1.4\times10^{-7}$ stat coulombs/dyne was computed. With respect to a positive value of $d_{33}$, the sign of $d_{31}=d_{32}$ was found to be negative in a separate experiment.

A bar of zinc oxide was cut from a massive vapor-grown crystal such that its long dimension made an angle of twenty degrees with the hexagonal axis and its width dimension was perpendicular to the hexagonal axis. Its dimensions were length=3.89 millimeters, width=1.54 millimeters and thickness=.52 millimeter. Silver electrodes were applied to the major faces and resonant and antiresonant frequencies were measured as above. An electromechanical coupling of 0.25 was obtained and a value of $d_{24}=d_{15}=-2.9\times10^{-7}$ stat coulombs/dyne was obtained according to the procedure described in Mason, op. cit. (making use of the values already obtained for $d_{33}$ and $d_{31}$).

Determination of the value of the coupling coefficient $k$ required measurement of certain other characteristics. These characteristics were found in general to favor a high $k$. Accordingly, Young's modulus for constant electric displacement with field measured along the C-axis and strain applied in the same direction ($S_{33}^D$) was found equal to $6.7\times10^{-13}$ cm.²/dyne. The same modulus for constant field with both field measured and strain applied in the 1 direction ($S_{11}^E$) was found equal to $8.4\times10^{-13}$. The dielectric constant for constant applied strain ($\epsilon^S$) was found to be isotropic and equal to a value of about 8.15. Following the teaching of Mason ["Electromechanical Transducers and Wave Filters," Second edition (Van Nostrand 1948) Section 6.32; and "Piezoelectric Crystals and Their Applications to Ultrasonics," page 452 (Van Nostrand 1950)] the electromechanical coupling coefficient for a plate of zinc oxide with the hexagonal axis perpendicular to the large area of the plate vibrating in a thickness mode may be written as:

$$k=(d_{33}C_{33}^{E}+2d_{31}C_{31}^{E})\sqrt{\frac{4\pi}{\epsilon_3^S C_{33}^D}} \qquad (2)$$

where the symbols are those defined by Mason in "Piezoelectric Crystals."

Based on the measurements cited above and employing the reasonable assumptions that $C_{31}^E=1/2\ C_{33}^E$ (determined for cadmium sulfide, a similar crystal, by D. I. Bolef, N. T. Melamed and M. Menes, Bulletin of the American Physical Society, series II, volume 5, page 169), and that $C_{33}^E\cong C_{33}^D$, and the fact that $C_{33}^D\cong S_{33}^D$, the coupling constant $k$ has the value .33.

The physical and chemical characteristics of zinc oxide are known. In general, this material does not react with ordinary atmospheric components and can withstand temperatures up to its decomposition point of about 1600° C. The characteristics set forth above indicate the suitability of piezoelectric zinc oxide in a variety of devices. Although a detailed description of such device uses is not considered within the proper scope of this disclosure, for convenience three device elements are schematically represented in the accompanying figures. All three devices are of standard design and are described elsewhere. See "Piezotronic Technical Data," published by Brush Electronics Company (1953), page 5 (FIG. 1) and page 8 (FIG. 2).

Referring again to FIG. 1, the device depicted is a typical hydrophone 1 employing a stack 2 of thin parallel-connected zinc oxide plates 3. The purpose of the stacked configuration, parallel-connected by means of interleaved foil electrodes not shown, is to obtain higher capacitance or lower impedance, unobtainable with a single thick crystalline block of given dimensions. Cover 4 of housing 1 is made of rubber or other flexible material so arranged as to yield under the influence of applied hydrostatic pressure. Coupling with crystal stack 2 is made through an oil or other fluid medium 5 which fills the entire interstitial volume between stack 2 and cover 4. All of plates 3 are oriented in the same manner, with the C-axis or 3 direction normal to their large faces shown disposed horizontally. Electrode contact is made via electrodes 6 and 7, which, as seen, are so arranged as to read off or produce a field also in the C direction. The device depicted therefore makes use of the $d_{33}$ piezoelectric constant.

The hydrophone of FIG. 1 is, of course, suitable for use as a transmitter as well as a receiver. As a transmitter, field is produced across the crystal stack by means of electrodes 6 and 7, and the physical vibration so produced is transferred through oil medium 5 and rubber cover 4 into the surrounding medium.

Figure 2:
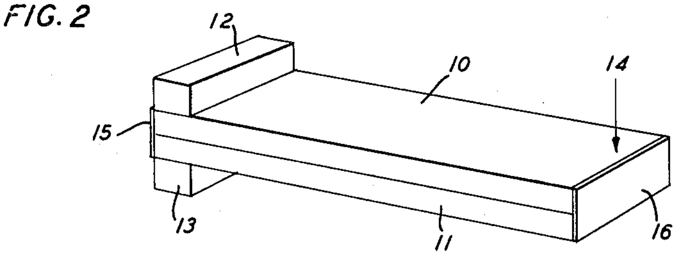
FIG. 2 is a perspective view of a cantilever mounted bender bimorph element also utilizing the piezoelectric material of this invention.

In FIG. 2 there is shown a cantilever mounted bender bimorph such as may find use in a crystal pick-up phonograph arm. The element shown consists of zinc oxide plates 10 and 11, both arranged with their C-axis corresponding with their length dimension but oriented in opposite directions so that compression on element 10 and tension on element 11 results in an electrical field of a given direction. Plates 10 and 11 are shown rigidly clamped between soft rubber or plastic pads 12 and 13. Application of force at point 14, which may result from the back and forth movement of a stylus produced by undulations in the grooves of a rotating phonograph record, produces an A.-C. voltage developed between electrodes 15 and 16. Leads, not shown, attached to the said electrodes 15 and 16 in turn serve as input leads to an audio amplifier, also not shown.

Figure 3:
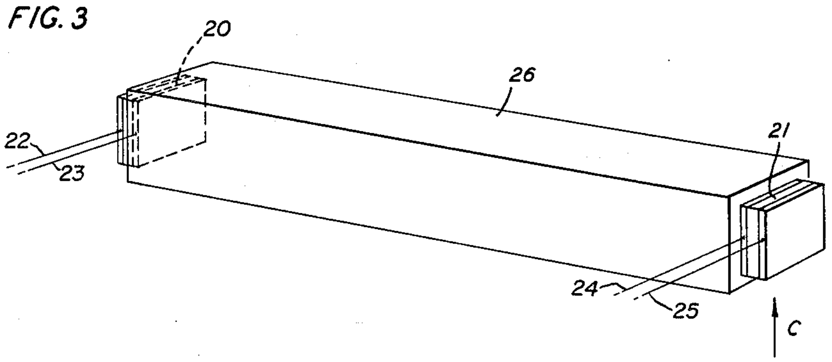
FIG. 3 is a perspective view of an ultrasonic delay line utilizing elements of the inventive material.

The device of FIG. 3 is an ultrasonic delay line arranged to operate in shear mode. This type of arrangement permits a longer physical vibrational path and so results in a longer delay for a given element length. The device consists of zinc oxide elements 20 and 21, each with its crystallographic C-axis lying in the plane of the plate. Each of the elements 20 and 21 has electrodes deposited or otherwise affixed to flat surfaces, the said electrodes in turn being electrically connected with wire leads 22 and 23 for element 20 and 24 and 25 for element 21. Elements 20 and 21 are cemented to vitreous silica delay element 26 which serves to transmit physical vibrations from one of the piezoelectric elements to the other. In operation, a signal impressed across, for example, leads 22 and 23 of element 20 results in a field produced in the 1 direction across that element, so producing shear in the 1–3 plane, that is, in the plane of the large flat faces of this element. This shear, of a frequency corresponding with the signal, is transmitted through delay element 26 and finally results in a similar shear being produced in piezoelectric element 21. The resulting signal produced across wire leads 24 and 25 is of the same frequency as that introduced across leads 22 and 23. A typical device of this class may have a length of the order of five inches and a square cross section of the order of three-quarters of an inch on a side.

It has been noted that zinc oxide is n-type as grown, probably due to an equilibrium excess of zinc in the lattice. An exemplary method of compensating for this conductivity mechanism has been described. Any other method achieving this end result is suitable. Although there are conflicting theories as to the precise mechanism of n-type conductivity compensation, actual practice has indicated that a sufficiently low conductivity, is easily obtained. Further, it appears that whatever system is used, the compensating mechanism is such that the appearance of p-type conductivity is unlikely, conversion attempts thus far resulting only in near compensation to a very low conductivity value and the appearance of excess acceptor impurity on the surface of the crystal. The described work was, in large part, carried out on crystals of so low a conductivity value as to be undetectable at room temperature by the ordinary four-probe resistivity method. Extrapolation of a measured value of $10^{-4}$ ohm$^{-1}$cm.$^{-1}$ at a temperature of 725° C. to room temperature indicates a conductivity of the order of $10^{-14}$ ohm$^{-1}$cm.$^{-1}$.

Tolerable conductivity values may be calculated on the basis of tolerable Q values in accordance with the relationship:

$$Q=R\omega C_1 \tag{3}$$

where

Q is a "quality factor."
R is the resistance of the crystal.
$\omega/2\pi=f$ is the frequency of operation.
$C_1$ is the motional capacitance of the crystal which may be written in terms of the electrical capacitance and the electromechanical coupling constant as $$C_1=C_0\frac{8}{\pi^2}\left[\frac{k^2}{1-k^2}\right]$$

If we choose $k=.45$ and the dielectric constant as 8.2

$$Q=\frac{4.5\times 10^{-12}f}{\sigma}$$

where $\sigma$ is the conductivity in $ohm^{-1}cm.^{-1}$.

On the basis of this relationship, it may be calculated that a tolerable Q value of 100 corresponds in turn with a room temperature conductivity of the order of $10^{-8}$ $ohm^{-1}cm.^{-1}$ for an operating frequency of 200 kilocycles. It is considered that, in general, most device uses require a minimum value of this order, so that for the purposes of this disclosure a room temperature conductivity value of $10^{-8}$ $ohm^{-1}cm.^{-1}$ is considered necessary. For many devices, Q values of a large magnitude are desired, this in turn indicating a preferred minimum room temperature conductivity of the order of $10^{-11}$ $ohm^{-1}cm.^{-1}$. This conductivity value is, therefore, considered to be a preferred lower limit for the purposes of this disclosure.

Depending on the method of acceptor impurity introduction, it is generally unobjectionable to leave any such impurity residue on the surface. In fact, it has been found that where the impurity is introduced by the surface introduction of lithium hydroxide, this residue may be beneficial in avoiding chemical or electrical changes resulting from a small photosensitivity evidenced by the zinc oxide. It has been indicated that the lowest value of conductivity so far obtained is, on the basis of extrapolation, indicated to be of the order of $10^{-14}$ $ohm^{-1}cm.^{-1}$ at room temperature. Before treatment, these crystals evidence a room temperature conductivity of the order of 5 to .01 $ohm^{-1}cm.^{-1}$, which appears to approximate the equilibrium range of zinc oxide as grown.

The invention has been described in terms of a limited number of exemplary embodiments. It is evident from the material characteristics set forth that these embodiments in no way form an exhaustive listing. In general, the piezoelectric material of this invention is considered suitable for all piezoelectric devices known, as well as for others which may be developed, providing these device configurations make use of at least one factor of any one of the piezoelectric tensor components unequal to zero, i.e., $d_{33}$, $d_{31}$, $d_{32}$, $d_{15}$ and $d_{24}$. As is well known, crystal cuts may beneficially make use of one or more of such tensor components in combination, as, for example, for the purpose of decreasing the piezoelectric temperature coefficient.

It should be clearly understood that methods of crystal growth and compensation have been presented for convenience only. Necessary crystal characteristics are set forth in such manner that the suitability of any alternate method may readily be determined. An alternate method of crystal growth, particularly suitable since the habit is such as to produce a crystal having its largest dimensions perpendicular to the C-axis, is disclosed in copending application Serial No. 20,634, filed April 7, 1960. Piezoelectric constants measured on such crystals have been found equal to those measured on crystals produced from vapor-phase growth. Any method resulting in good crystals of the desired conductivity level is suitable.

What is claimed is:

1. A piezoelectric device comprising at least one element consisting essentially of a single crystal of zinc oxide of a maximum room temperature conductivity of $10^{-8}$ $ohm^{-1}$ $cm.^{-1}$ and means for making electrode contact with the said element on two faces.

2. The device of claim 1 in which the smallest dimension of the said element corresponds with the crystallographic C-axis and in which electrode contact is made to two faces perpendicular to the C-axis.

3. The device of claim 1 in which the smallest dimension of the said element corresponds with the crystallographic C-axis and in which electrode contact is made to two faces in which the C-axis lies.

4. The device of claim 1 in which the smallest dimension of the said element is in a direction perpendicular to the C-axis and in which electrode contact is made to two faces perpendicular to the said direction.

5. A piezoelectric device including at least one element consisting essentially of a single crystal of zinc oxide together with electrode contact to two faces of the said element, the crystallographic orientation and cut of the said element being such that operation of the device makes use of extensional strain.

6. A piezoelectric device including at least one element consisting essentially of a single crystal of zinc oxide together with electrode contact to two opposing faces of the said element, the crystallographic orientation and cut of the said element being such that operation makes use of strain.

References Cited in the file of this patent

UNITED STATES PATENTS

| | | |
|---|---|---|
| 2,410,825 | Lane | Nov. 12, 1946 |
| 2,434,648 | Goodale et al. | Jan. 20, 1948 |
| 2,596,460 | Arenberg | May 13, 1952 |

FOREIGN PATENTS

| | | |
|---|---|---|
| 311,055 | Great Britain | May 9, 1929 |